US009761672B1

(12) United States Patent
Nelson et al.

(10) Patent No.: US 9,761,672 B1
(45) Date of Patent: Sep. 12, 2017

(54) SEMICONDUCTOR COMPONENT INCLUDING ALUMINUM SILICON NITRIDE LAYERS

(71) Applicant: Infineon Technologies Americas Corp., El Segundo, CA (US)

(72) Inventors: Scott Nelson, River Falls, WI (US); Srinivasan Kannan, Maplewood, MN (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/057,985

(22) Filed: Mar. 1, 2016

(51) Int. Cl.
| H01L 29/78 | (2006.01) |
| H01L 29/06 | (2006.01) |
| H01L 21/02 | (2006.01) |
| H01L 29/205 | (2006.01) |
| H01L 29/20 | (2006.01) |
| H01L 29/778 | (2006.01) |
| H01L 33/32 | (2010.01) |
| H01L 33/00 | (2010.01) |
| H01L 33/12 | (2010.01) |
| H01L 31/109 | (2006.01) |
| H01L 31/0304 | (2006.01) |
| H01S 5/323 | (2006.01) |

(52) U.S. Cl.
CPC ........ *H01L 29/205* (2013.01); *H01L 29/2003* (2013.01); *H01L 29/778* (2013.01); *H01L 31/03044* (2013.01); *H01L 31/109* (2013.01); *H01L 33/0025* (2013.01); *H01L 33/12* (2013.01); *H01L 33/32* (2013.01); *H01S 5/32341* (2013.01)

(58) Field of Classification Search
CPC . H01L 29/205; H01L 29/778; H01L 29/2003; H01L 27/7827; H01L 31/109; H01L 31/03044; H01L 33/12; H01L 33/32; H01L 33/0025; H01S 5/32341
USPC .... 257/76, 189, 190, 194, E29.091, E21.09; 438/172, 478
See application file for complete search history.

(56) References Cited

U.S. PATENT DOCUMENTS

| 7,825,432 | B2 | 11/2010 | Saxler | |
| 8,748,939 | B2* | 6/2014 | Takizawa | H01L 21/02381 257/189 |
| 2010/0117118 | A1* | 5/2010 | Dabiran | H01L 29/207 257/190 |
| 2013/0240951 | A1* | 9/2013 | Bedell | H01L 29/66462 257/194 |
| 2015/0221760 | A1* | 8/2015 | Kub | H01L 29/41725 257/76 |
| 2016/0043185 | A1* | 2/2016 | Liu | H01L 21/02304 257/488 |
| 2016/0043218 | A1* | 2/2016 | Moens | H01L 29/7827 257/329 |
| 2016/0043219 | A1* | 2/2016 | Liu | H01L 29/7827 257/329 |

* cited by examiner

*Primary Examiner* — Dao H Nguyen
(74) *Attorney, Agent, or Firm* — Murphy, Bilak & Homiller, PLLC

(57) ABSTRACT

There are disclosed herein various implementations of a semiconductor component including one or more aluminum silicon nitride layers. The semiconductor component includes a substrate, a group III-V intermediate body situated over the substrate, a group III-V buffer layer situated over the group III-V intermediate body, and a group III-V device fabricated over the group III-V buffer layer. The group III-V intermediate body includes the one or more aluminum silicon nitride layers.

12 Claims, 5 Drawing Sheets

SEMICONDUCTOR COMPONENT INCLUDING ALUMINUM SILICON NITRIDE LAYERS

BACKGROUND

I. Definition

As used herein, "III-Nitride" or "III-N" refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-N also refers generally to any polarity including but not limited to Ga-polar, N-polar, semi-polar, or non-polar crystal orientations. A III-N material may also include either the Wurtzitic, Zincblende, or mixed polytypes, and may include single-crystal, monocrystalline, polycrystalline, or amorphous structures. Gallium nitride or GaN, as used herein, refers to a III-N compound semiconductor wherein the group III element or elements include some or a substantial amount of gallium, but may also include other group III elements in addition to gallium. A III-N or a GaN transistor may also refer to a composite high voltage enhancement mode transistor that is formed by connecting the III-N or the GaN transistor in cascode with a lower voltage group IV transistor.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as single-crystal or polycrystalline SiC on silicon, silicon on insulator (SOI), separation by implantation of oxygen (SIMOX) process substrates, and silicon on sapphire (SOS), for example.

It is noted that, as used herein, the terms "low voltage" or "LV" in reference to a transistor or switch describes a transistor or switch with a voltage range of up to approximately fifty volts (50V). It is further noted that use of the term "midvoltage" or "MV" refers to a voltage range from approximately fifty volts to approximately two hundred volts (approximately 50V to 200V). Moreover, the term "high voltage" or "HV," as used herein, refers to a voltage range from approximately two hundred volts to approximately twelve hundred volts (approximately 200V to 1200V), or higher.

II. Background Art

Group III-V semiconductors, such as gallium nitride (GaN) and other III-Nitride materials have become increasingly important for the fabrication of optoelectronic devices, such as light-emitting diodes (LEDs), lasers, and ultraviolet (UV) photodetectors. In addition, group III-V semiconductors are desirable for use in the fabrication of power switching devices, such as III-Nitride or other group III-V heterostructure field-effect transistors (HFETs) and Schottky diodes, for example.

Due to the typically small size and high cost of native group III-V wafers, non-native substrates including sapphire, silicon carbide (SiC), and silicon substrates are commonly used to grow the group III-V films providing the group III-V device active layers. Among these non-native substrates, silicon is advantageous because of its large wafer size, low cost, and ease of processing. However, the use of silicon substrates for the fabrication of group III-V devices presents considerable challenges. For example, lattice mismatch and differences in the thermal expansion coefficients between group III-V semiconductors and silicon can undesirably result in high density crystal dislocations and significant wafer bow induced by group III-V film stress.

SUMMARY

The present disclosure is directed to a semiconductor component including aluminum silicon nitride layers, substantially as shown in and/or described in connection with at least one of the figures, and as set forth in the claims.

DETAILED DESCRIPTION

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, group III-V semiconductors, such as gallium nitride (GaN) and other III-Nitride materials are important and desirable for the fabrication of optoelectronic and power switching devices. As further stated above, due to disadvantages associated with conventional native III-Nitride or other group III-V substrates, silicon substrates are often used as non-native substrates for group III-V devices. However, it has been noted that the use of silicon substrates for the fabrication of group III-V devices presents considerable challenges. For example, lattice mismatch and differences in the thermal expansion coefficients between group III-V semiconductors and silicon can undesirably result in high density crystal dislocations and significant wafer bow induced by group III-V film stress.

The present application is directed to a semiconductor component having a group III-V intermediate body including one or more aluminum silicon nitride layers, and a method for fabricating such a semiconductor component. The use of one or more aluminum silicon layers advantageously enables the growth of overlying group III-V layers or films having substantially improved crystal quality. That is to say, the overlying group III-V layers or films have reduced crystal dislocations compared to group III-V layers or films in conventional semiconductor components from which the presently disclosed aluminum silicon nitride layer or layers is/are omitted. As a result, group III-V film stress induced wafer bow may be advantageously reduced in a semiconductor component having a group III-V intermediate body including one or more aluminum silicon nitride layers as disclosed herein.

Figure 1:
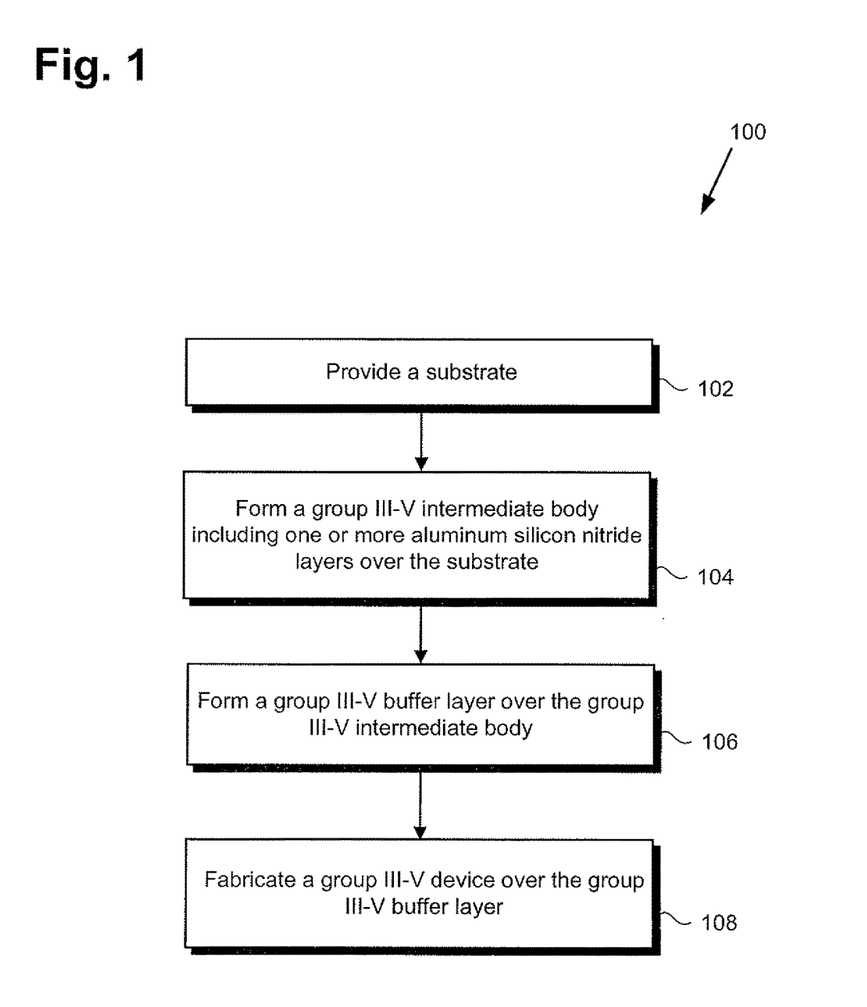
FIG. 1 shows a flowchart presenting an exemplary method for fabricating a semiconductor component including one or more aluminum silicon nitride layers, according to one implementation.

Referring to FIG. 1, FIG. 1 shows flowchart 100 presenting an exemplary method for fabricating a semiconductor component including one or more aluminum silicon nitride layers. It is noted that certain details and features have been left out of flowchart 100 that are apparent to a person of ordinary skill in the art, in order not to obscure the discussion of the inventive features in the present application.

Figure 2A:
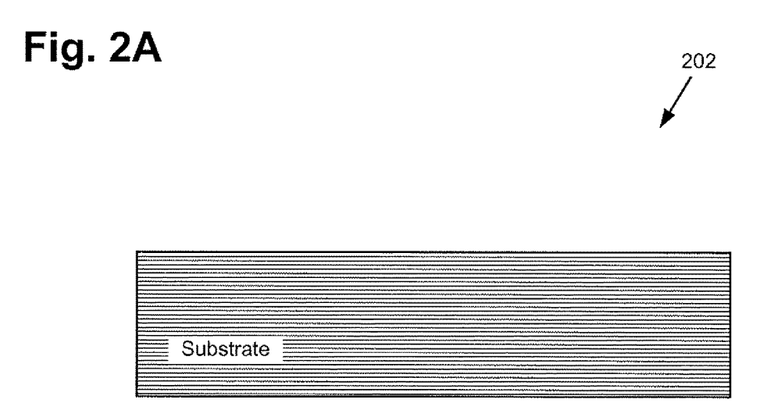
FIG. 2A shows a cross-sectional view of an exemplary structure corresponding to an initial fabrication stage according to one implementation of the flowchart of FIG. 1.

Referring now to FIG. 2A, FIG. 2A shows a cross-sectional view of substrate 202. In particular, substrate 202 is selected so as to be suitable for use as a support substrate for a group III-V device. Proceeding on to FIGS. 2B and 2C, structures 204, and 206 show the result of forming a group III-V intermediate body (action 104) and forming a group III-V buffer layer (action 106), respectively, over substrate 202. Moreover, FIG. 2D, shows a cross-sectional view of a semiconductor component including an aluminum silicon nitride layer according to a first exemplary implementation, while FIG. 3 shows such a view of a semiconductor component including multiple aluminum silicon nitride layers, according to a second exemplary implementation.

It is noted that the structures shown in FIGS. 2A, 2B, 2C, 2D, and 3 (hereinafter "FIGS. 2A-2D and 3") are provided as specific implementations of the present inventive principles, and are shown with such specificity for the purposes of conceptual clarity. It should also be understood that particular details such as the materials used to form the structures shown in FIGS. 2A-2D and 3, and the techniques used to produce the various depicted features, are being provided merely as examples, and should not be interpreted as limitations.

Referring to FIG. 2A in conjunction with FIG. 1, flowchart 100 begins with providing substrate 202 (action 102). As noted above, substrate 202 may include any material suitable for use as a substrate for fabrication of a group III-V device. Examples of group III-V devices for which substrate 202 may be utilized include group III-V heterostructure field-effect transistors (HFETs), such as group III-V high electron mobility transistors (HEMTs), and optoelectronic devices.

Substrate 202 may be formed of a group IV material such as silicon (Si), or may be a silicon carbide (SiC) or sapphire substrate. Moreover, although substrate 202 is shown as a substantially unitary substrate in FIG. 2A, in other implementations, substrate 202 may be a composite substrate, such as a silicon on insulator (SOT) substrate, a separation by implantation of oxygen (SIMOX) process substrate, a silicon on sapphire (SOS) substrate, or a single-crystal or polycrystalline SiC on silicon substrate, for example.

Figure 2B:
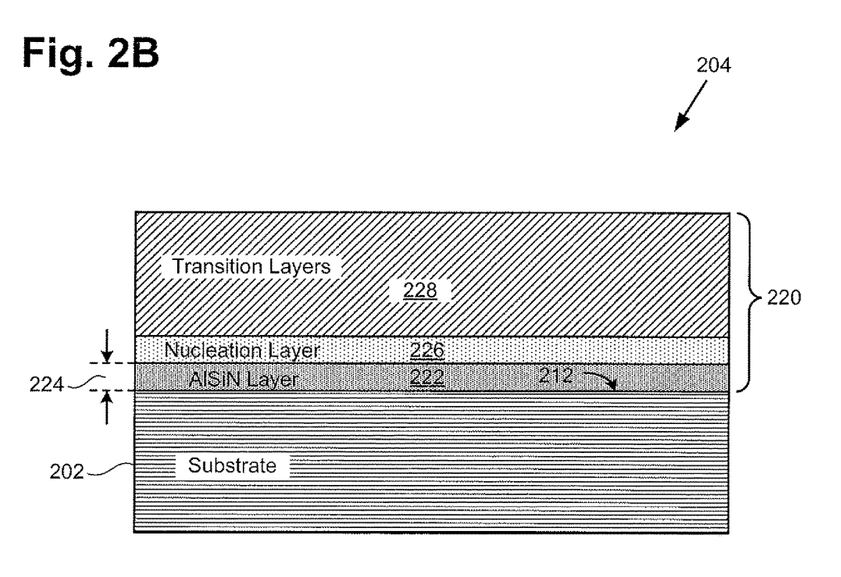
FIG. 2B shows a cross-sectional view of the exemplary structure of FIG. 2A at a subsequent fabrication stage according to one implementation of the flowchart of FIG. 1.
Figure 3:
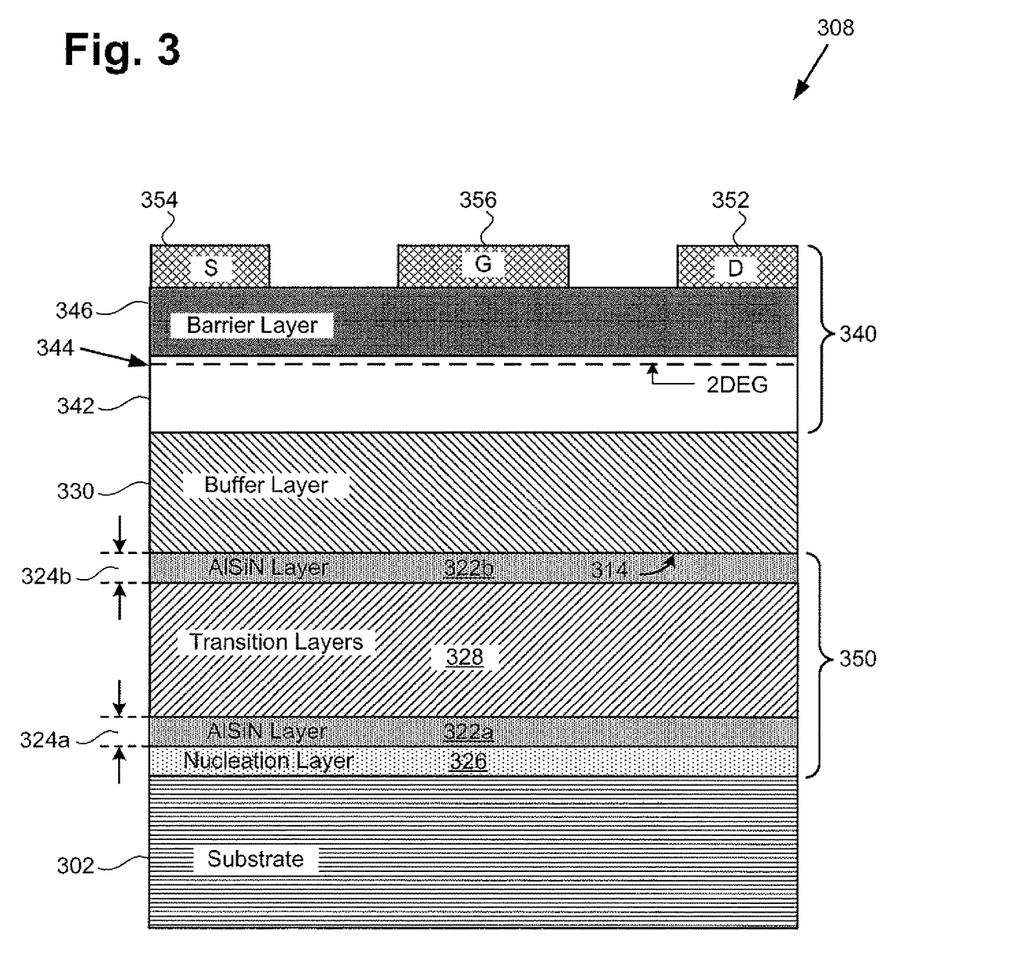
FIG. 3 shows a cross-sectional view of an exemplary semiconductor component including one or more aluminum silicon nitride layers, according to another implementation.

Moving to FIG. 2B with continued reference to FIG. 1, flowchart 100 continues with forming group III-V intermediate body 220 including aluminum silicon nitride layer 222 over substrate 202 (action 104). As shown in FIG. 2B, in addition to aluminum silicon nitride layer 222, group III-V intermediate body 220 further includes nucleation layer 226 situated over aluminum silicon nitride layer 222, and transition layers 228 situated over nucleation layer 226.

As shown by structure 204, aluminum silicon nitride layer 222 has bottom surface 212 and thickness 224, and is formed so as to be the bottom layer of group III-V intermediate body 220. For example, in one implementation, aluminum silicon nitride layer 222 may be formed directly on substrate 202 such that bottom surface 212 of aluminum silicon nitride layer 222 adjoins substrate 202. Aluminum silicon nitride layer 222 may be formed so as to have an aluminum concentration of up to approximately twenty-five percent (25%), for example. Moreover, aluminum silicon nitride layer 222 is typically positively charged.

Aluminum silicon nitride layer 222 may be formed on or over substrate 202 using any suitable technique. For example, aluminum silicon nitride layer 222 may be formed using metalorganic chemical vapor deposition (MOCVD), molecular-beam epitaxy (MBE), or hydride vapor phase epitaxy (HVPE), to name a few suitable techniques. In one implementation, for example, aluminum silicon nitride layer 222 may be formed at a temperature in a range between approximately six hundred and fifty and approximately one thousand and fifty degrees Celsius (650-1,050° C.). Thickness 224 of aluminum silicon nitride layer 222 may be in a range from less than approximately one nanometer to approximately forty nanometers (<1.0-40 nm), for instance.

According to the implementation shown by structure 204, nucleation layer 226 is situated over aluminum silicon nitride layer 222. Nucleation layer 226 may be formed of aluminum nitride (AlN), for example. Nucleation layer 226 may be formed directly on or over aluminum silicon nitride layer 222 using any of MOCVD, MBE, or HVPE. It is noted that although flowchart 100 describes group III-V intermediate body 220 including aluminum silicon nitride layer 222 as being formed over substrate 202, in some implementations, aluminum silicon nitride layer 222 may be formed ex situ. In those implementations, for example, aluminum silicon nitride layer 222 may be situated over substrate 202 prior to formation of nucleation layer 226 and transition layers 228 of group III-V intermediate body 220.

As shown in FIG. 2B, in implementations in which substrate 202 is a non-native substrate for fabrication of a group III-V device, group III-V intermediate body 220 may include transition layers 228 situated between substrate 202 and a subsequently fabricated group III-V device. As a specific example, where substrate 202 is a silicon substrate, transition layers 228 may include multiple distinguishable group III-V layers helping to mediate the lattice transition from substrate 202 to the active layers of the overlying group III-V device (active layers not shown in FIG. 2B).

In implementations in which the group III-V device is a gallium nitride (GaN) or other III-Nitride semiconductor based device, for example, transition layers 228 may include a series of aluminum gallium nitride (AlGaN) layers having a progressively reduced aluminum content relative to their gallium content, until a suitable transition to overlying buffer and/or active layers is achieved. Moreover, in some implementations, transition layers 228 may be compositionally graded layers having different AlGaN, or other III-Nitride or group III-V alloy compositions at the respective top and bottom surfaces of each layer. Transition layers 228 may be formed over nucleation layer 226 using any of MOCVD, MBE, or HVPE, for example. In other implementations, super lattice structures are used for transition layers instead of, or in addition to, compositionally graded layers.

Figure 2C:
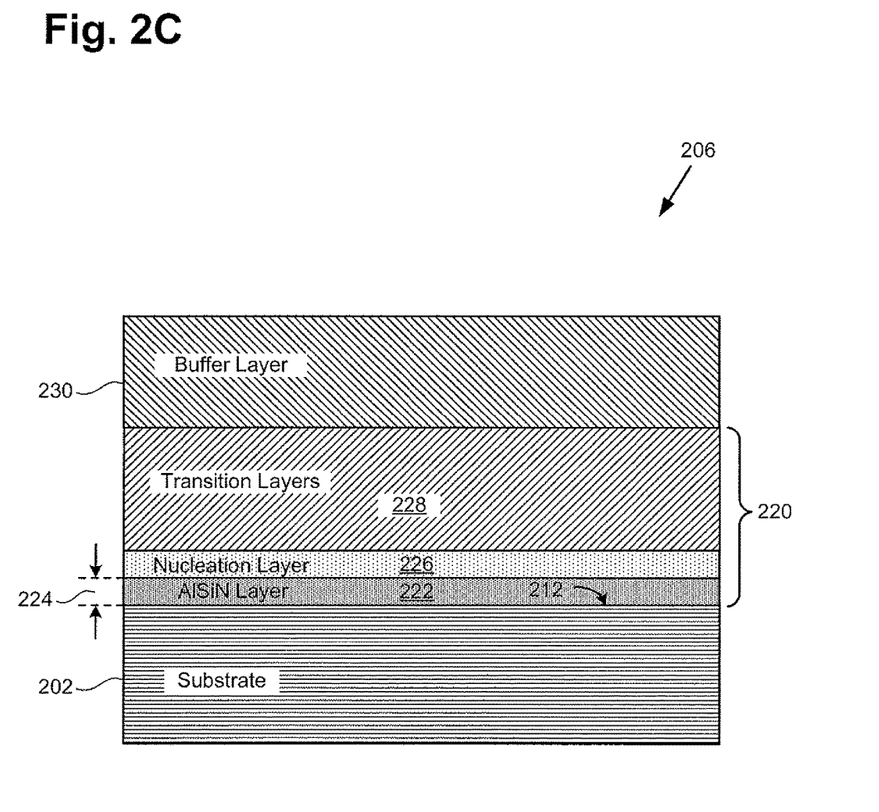
FIG. 2C shows a cross-sectional view of the exemplary structure of FIG. 2B at a subsequent fabrication stage according to one implementation of the flowchart of FIG. 1.
Figure 2D:
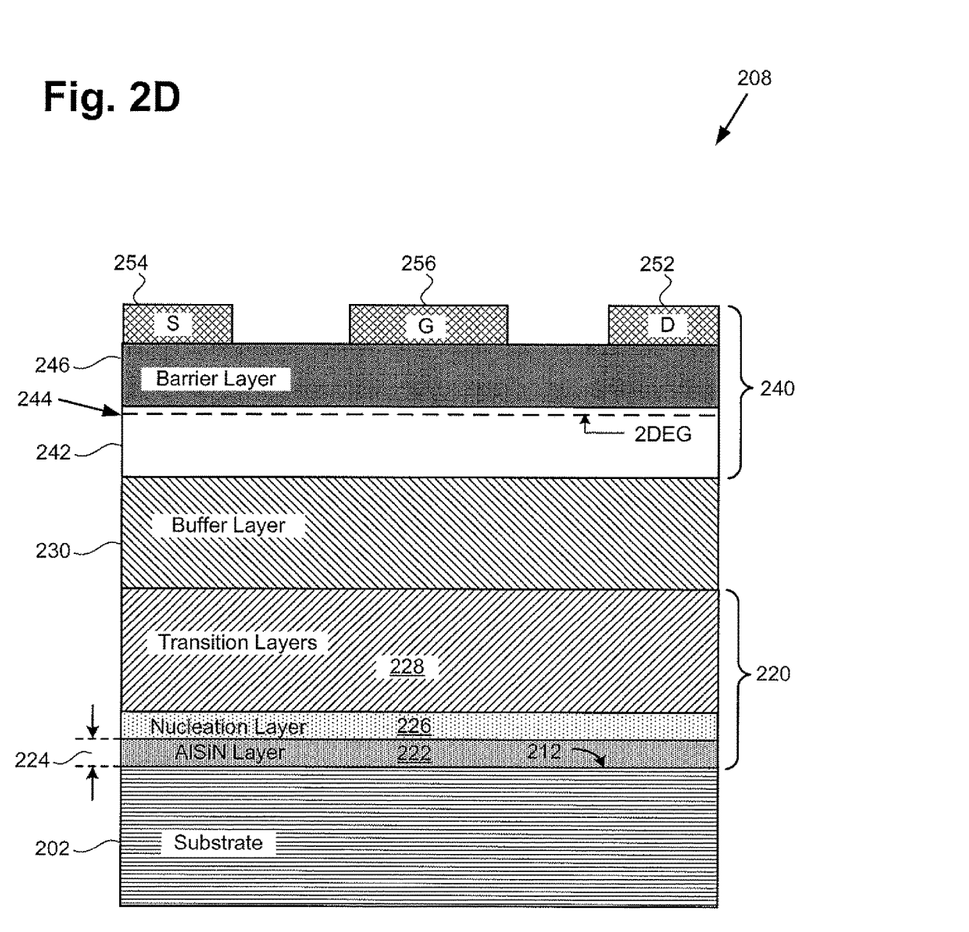
FIG. 2D shows a cross-sectional view of an exemplary semiconductor component including one or more aluminum silicon nitride layers, according to one implementation.

Referring now to FIG. 2C while continuing to refer to FIG. 1, flowchart 100 continues with forming group III-V buffer layer 230 over group III-V intermediate body 220 (action 106). As shown by structure 206, buffer layer 230 may be formed so as to be situated directly on or over group III-V intermediate body 220. In implementations in which the subsequently fabricated overlying group III-V device is a GaN based device, for example, group III-V buffer layer 230 may be implemented as an intrinsic GaN layer. Like the various layers of group III-V intermediate body 220, group III-V buffer layer 230 may be formed using any of MOCVD, MBE, or HYPE.

Continuing to FIG. 2D with further reference to FIG. 1, flowchart 100 continues with fabricating group III-V device 240 over group III-V buffer layer 230 (action 108). As a result, FIG. 2D shows a cross-sectional view of exemplary semiconductor component 208, which includes group III-V intermediate body 220 with aluminum silicon nitride layer 222.

It is noted that although group III-V device 240 is depicted as a HEMT in FIG. 2D, that representation is merely exemplary. In other implementations, semiconductor component 208 including aluminum silicon nitride layer 222 may be suitably adapted to provide another type of group III-V device corresponding to group III-V device 240. For example, in other implementations, group III-V device 240 may take the form of another type of group III-V power switching device, such as any type of HFET, or a Schottky diode. Alternatively, in some implementations, group III-V device 240 may take the form of an optoelectronic device, such as a light-emitting diode (LED), laser, or ultraviolet (UV) photodetector, for example.

Nevertheless, for merely exemplary purposes, group III-V device 240 will be described as a III-Nitride HEMT (hereinafter "HEMT 240") including active layers in the form of gallium nitride (GaN) channel layer 242 and overlying aluminum gallium nitride (AlGaN) barrier layer 246, drain electrode 252, source electrode 254, and gate 256. As shown in FIG. 2D, in its on-state, HEMT 240 includes two-dimensional electron gas (2DEG) 244 providing a low resistance conduction channel between drain electrode 252 and source electrode 254. As further shown in FIG. 2D, 2DEG 244 is generated at or near the interface of the active layers of HEMT 240, i.e., GaN channel layer 242 and AlGaN barrier layer 246 having a larger bandgap than that of GaN channel layer 242.

Active GaN channel layer 242 and AlGaN barrier layer 244 of HEMT 240 may be formed over group III-V buffer layer 230, which may be an intrinsic GaN buffer layer, for example, using any of a number of known growth techniques. For instance, GaN channel layer 242 and AlGaN barrier layer 244 may be formed using MOCVD, MBE, or HVPE, to name a few suitable techniques.

According to the exemplary implementation shown in FIG. 2D, aluminum silicon nitride layer 222 advantageously increases a crystal lattice match between active GaN channel layer 242 of HEMT 240 and group III-V buffer layer 230 in semiconductor component 208. Moreover, aluminum silicon nitride layer 222 substantially improves overall group III-V crystal quality in semiconductor component 208 when compared to semiconductor components from which aluminum silicon nitride layer 222 is omitted. For example, the presence of aluminum silicon nitride layer 222 results in the epitaxial group III-V layers of semiconductor component 208, e.g., GaN channel layer 242, and AlGaN barrier layer 244, having lower etch pitch counts, as measured by atomic force microscopy (AFM), lower dislocation densities, as measured by transmission electron microscopy (TEM), and for example a fifty percent (50%) reduction (or even a greater than 50% reduction) in the x-ray diffraction full width at half maximum (XRD FWHM) when compared to epitaxial group III-V layers in conventional semiconductor components from which aluminum silicon nitride layer 222 is omitted.

Referring now to FIG. 3, FIG. 3 shows a cross-sectional view of exemplary semiconductor component 308 including group III-V intermediate body 320 having multiple aluminum silicon nitride layers 322a and 322b. It is noted that the features in FIG. 3 identified by reference numbers corresponding to those shown in FIGS. 2A-2D, correspond respectively to those previously described features.

Thus, substrate 302 and group III-V buffer layer 330 correspond respectively to substrate 202 in FIGS. 2A-2D and group III-V buffer layer 230 in FIGS. 2C and 2D, and may share any of the characteristics attributed to those corresponding features in the present application. In addition, group III-V device 340, in FIG. 3, corresponds to HEMT 240, in FIG. 2D and may share any of the characteristics attributed to that corresponding feature in the present application. Thus, channel layer 342, barrier layer 346, 2DEG 344, drain electrode 352, source electrode 354, and gate 356, in FIG. 3, correspond respectively to GaN channel layer 242, AlGaN barrier layer 246, 2DEG 244, drain electrode 252, source electrode 254, and gate 256, in FIG. 2D.

It is noted that although group III-V device 340 is shown and described as corresponding to HEMT 240. In other implementations, semiconductor component 308 may be suitably adapted to provide another type of group III-V device corresponding to group III-V device 340. For example, in other implementations, group III-V device 340 may take the form of another type of group III-V power switching device, such as any type of HFET, or a Schottky diode. Alternatively, in some implementations, group III-V device 340 may take the form of an optoelectronic device, such as an LED, laser, or UV photodetector, for example.

Nucleation layer 326 and transition layers 328 of group III-V intermediate body 350, in FIG. 3, correspond respectively to nucleation layer 226 and transition layers 228 in FIGS. 2B, 2C, and 2D, and may share any of the characteristics attributed to those corresponding features in the present application. Moreover, each of lower aluminum silicon nitride layer 322a having thickness 324a, and upper aluminum silicon nitride layer 322b having thickness 324b corresponds in general to aluminum silicon nitride layer 222 having thickness 224, in FIGS. 2B, 2C, and 2D, and may share any of the characteristics attributed to that corresponding feature in the present application.

Thus, like aluminum silicon nitride layer 222, each of lower aluminum silicon nitride layer 322a and upper aluminum silicon nitride layer 322b may be formed so as to have an aluminum concentration of up to approximately 25%, for example. In addition, like aluminum silicon nitride layer 222, each of lower aluminum silicon nitride layer 322a and upper aluminum silicon nitride layer 322b is typically positively charged. Furthermore, and also like aluminum silicon nitride layer 222, each of lower aluminum silicon nitride layer 322a and upper aluminum silicon nitride layer 322b may be formed at a temperature in a range of approximately 650-1,050° C. to respective thickness 324a/324b of up to approximately 40 nm using any of MOCVD, MBE, or HVPE, for example.

In contrast to group III-V intermediate body 220, in FIGS. 2B, 2C, and 2D, however, group III-V intermediate body 350 includes multiple aluminum silicon nitride layers, i.e., lower aluminum silicon nitride layer 322a and upper aluminum silicon nitride layer 322b. In addition, according to the implementation shown in FIG. 3, nucleation layer 326 is situated over substrate 302, while lower aluminum silicon nitride layer 322a is situated over nucleation layer 326.

As shown by structure 308, transition layers 328 and upper aluminum silicon nitride layer 322b are situated over nucleation layer 326 and lower aluminum silicon nitride layer 322a. As further shown by structure 308, upper aluminum silicon nitride layer 322b has top surface 314, and is formed so as to be the top layer of group III-V intermediate body 350. As a result, in one implementation, group III-V buffer layer 330 may be formed directly on upper aluminum silicon nitride layer 322b such that top surface 314 of upper aluminum silicon nitride layer 322b adjoins group III-V buffer layer 330.

It is noted that the positioning of aluminum silicon nitride layer 222, lower aluminum silicon nitride layer 322a, and upper aluminum silicon nitride layer 322b depicted in the present figures is merely exemplary. In other implementations, for example, one or more aluminum silicon nitride layers may be situated as interlayers among transitions layers 228/328.

According to the exemplary implementation shown in FIG. 3, lower aluminum silicon nitride layer 322a and upper aluminum silicon nitride layer 322b advantageously increase a crystal lattice match between channel layer 342 of group III-V device and group III-V buffer layer 330 in semiconductor component 308. Moreover, lower aluminum silicon nitride layer 322a and upper aluminum silicon nitride layer 322b substantially improve overall group III-V crystal quality in semiconductor component 308 when compared to semiconductor components from which aluminum silicon nitride layers are omitted. For example, lower aluminum silicon nitride layer 322a and upper aluminum silicon nitride layer 322b result in the epitaxial group III-V layers of semiconductor component 308, e.g., channel layer 342 and barrier layer 346, having lower etch pitch counts as measured by AFM, lower dislocation densities as measured by TEM, and an up to 50% reduction in the XRD FWHM when compared to epitaxial group III-V layers in conventional semiconductor components from which aluminum silicon nitride layers are omitted.

Thus, the present application discloses a semiconductor component having a group III-V intermediate body including one or more aluminum silicon nitride layers that advantageously enable the growth of group III-V layers or films having substantially improved crystal quality. That is to say, the subsequently grown overlying group III-V layers or films have reduced crystal dislocations compared to group III-V layers or films in conventional semiconductor components from which the presently disclosed aluminum silicon nitride layer(s) is/are omitted. As a result, group III-V film stress induced wafer bow may be advantageously reduced in a semiconductor component having a group III-V intermediate body including one or more aluminum silicon nitride layers, as disclosed herein.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor component comprising:
    a substrate;
    a group III-V intermediate body situated over said substrate;
    a group III-V buffer layer situated over said group III-V intermediate body;
    a group III-V device fabricated over said group III-V buffer layer;
    wherein said group III-V intermediate body comprises at least one aluminum silicon nitride layer and a nucleation layer,
    wherein said at least one aluminium silicon nitride layer is formed directly on said substrate,
    wherein said nucleation layer is formed directly on said aluminium silicon nitride layer.

2. The semiconductor component of claim 1, wherein said group III-V intermediate body comprises an additional aluminum silicon nitride layer being situated over said nucleation layer.

3. The semiconductor component of claim 2, wherein said additional aluminum silicon nitride layer is a top layer of said group III-V intermediate body.

4. The semiconductor component of claim 1, wherein said group III-V intermediate body comprises at least one transition layer situated over said nucleation layer.

5. The semiconductor component of claim 1, wherein said at least one aluminum silicon nitride layer has an aluminum concentration of up to approximately twenty-five percent (25%).

6. The semiconductor component of claim 1, wherein said group III-V device comprises a group III-V heterostructure field-effect transistor (HFET).

7. The semiconductor component of claim 1, wherein said group III-V device comprises a group III-V optoelectronic device.

8. A semiconductor component comprising:
    a substrate;
    a group III-V intermediate body including a nucleation layer situated over said substrate;
    said group III-V intermediate body including a lower aluminum silicon nitride layer situated over said nucleation layer;
    said group III-V intermediate body including transition layers and an upper aluminum silicon nitride layer situated over said lower aluminum silicon nitride layer;
    a group III-V buffer layer situated over said group III-V intermediate body;
    a group III-V device fabricated over said group III-V buffer layer.

9. The semiconductor component of claim 8, wherein said upper aluminum silicon nitride layer is a top layer of said group III-V intermediate body.

10. The semiconductor component of claim 8, wherein each of said lower aluminum silicon nitride layer and said upper aluminum silicon nitride layer has an aluminum concentration of up to approximately twenty-five percent (25%).

11. The semiconductor component of claim 8, wherein said group III-V device comprises a group III-V heterostructure field-effect transistor (HFET).

12. The semiconductor component of claim 8, wherein said group III-V device comprises a group III-V optoelectronic device.

\* \* \* \* \*